United States Patent
Bottoni et al.

(10) Patent No.: US 11,259,123 B2
(45) Date of Patent: Feb. 22, 2022

(54) METHOD AND CIRCUIT FOR OPERATING A PIEZOELECTRIC MEMS SOUND TRANSDUCER AND INTEGRATED CIRCUIT COMPRSING SUCH A CIRCUIT

(71) Applicant: USound GMBH, Graz (AT)

(72) Inventors: Ferruccio Bottoni, Graz (AT); Markus Haensler, Graz (AT); Andrea Rusconi Clerici Beltrami, Vienna (AT)

(73) Assignee: USound GmbH, Graz (AT)

( * ) Notice: Subject to any disclaimer, the term of this patent is extended or adjusted under 35 U.S.C. 154(b) by 390 days.

(21) Appl. No.: 16/332,558

(22) PCT Filed: Sep. 13, 2017

(86) PCT No.: PCT/EP2017/073050
§ 371 (c)(1),
(2) Date: Mar. 12, 2019

(87) PCT Pub. No.: WO2018/050712
PCT Pub. Date: Mar. 22, 2018

(65) Prior Publication Data
US 2021/0266675 A1    Aug. 26, 2021

(30) Foreign Application Priority Data
Sep. 14, 2016   (DE) .......................... 102016117239.1

(51) Int. Cl.
*H04R 17/00* (2006.01)
*H01L 41/04* (2006.01)
*H04R 3/00* (2006.01)

(52) U.S. Cl.
CPC ........... *H04R 17/00* (2013.01); *H01L 41/042* (2013.01); *H04R 3/00* (2013.01)

(58) Field of Classification Search
USPC ................... 381/26, 114, 150, 163, 173, 190
See application file for complete search history.

(56) References Cited

U.S. PATENT DOCUMENTS

| 4,947,074 A | 8/1990 | Suzuki |
| 5,543,679 A | 8/1996 | Morino et al. |

(Continued)

FOREIGN PATENT DOCUMENTS

| CN | 1458742 | 11/2003 |
| CN | 203482389 | 3/2004 |

(Continued)

OTHER PUBLICATIONS

German Search Report, dated Jul. 12, 2017, 12 Pages.

(Continued)

*Primary Examiner* — Yosef K Laekemariam
(74) *Attorney, Agent, or Firm* — Dority & Manning, P.A.

(57) ABSTRACT

A method is provided for operating a piezoelectric MEMS sound transducer in the audible wavelength spectrum and/or in the ultrasonic range. The method includes storing electrical energy in an energy store and indirectly transferring this electrical energy via a transfer unit between the energy store and the piezoelectric MEMS sound transducer. In a first switching state, the transfer unit is first of all charged from the energy store. In a second switching state, the transfer unit is discharged and the piezoelectric MEMS sound transducer is charged. In a third switching state, the piezoelectric MEMS sound transducer is discharged and the transfer unit is charged. In a fourth switching state, the transfer unit is then discharged and the energy store is charged.

16 Claims, 3 Drawing Sheets

(56) References Cited

U.S. PATENT DOCUMENTS

Figure 1:
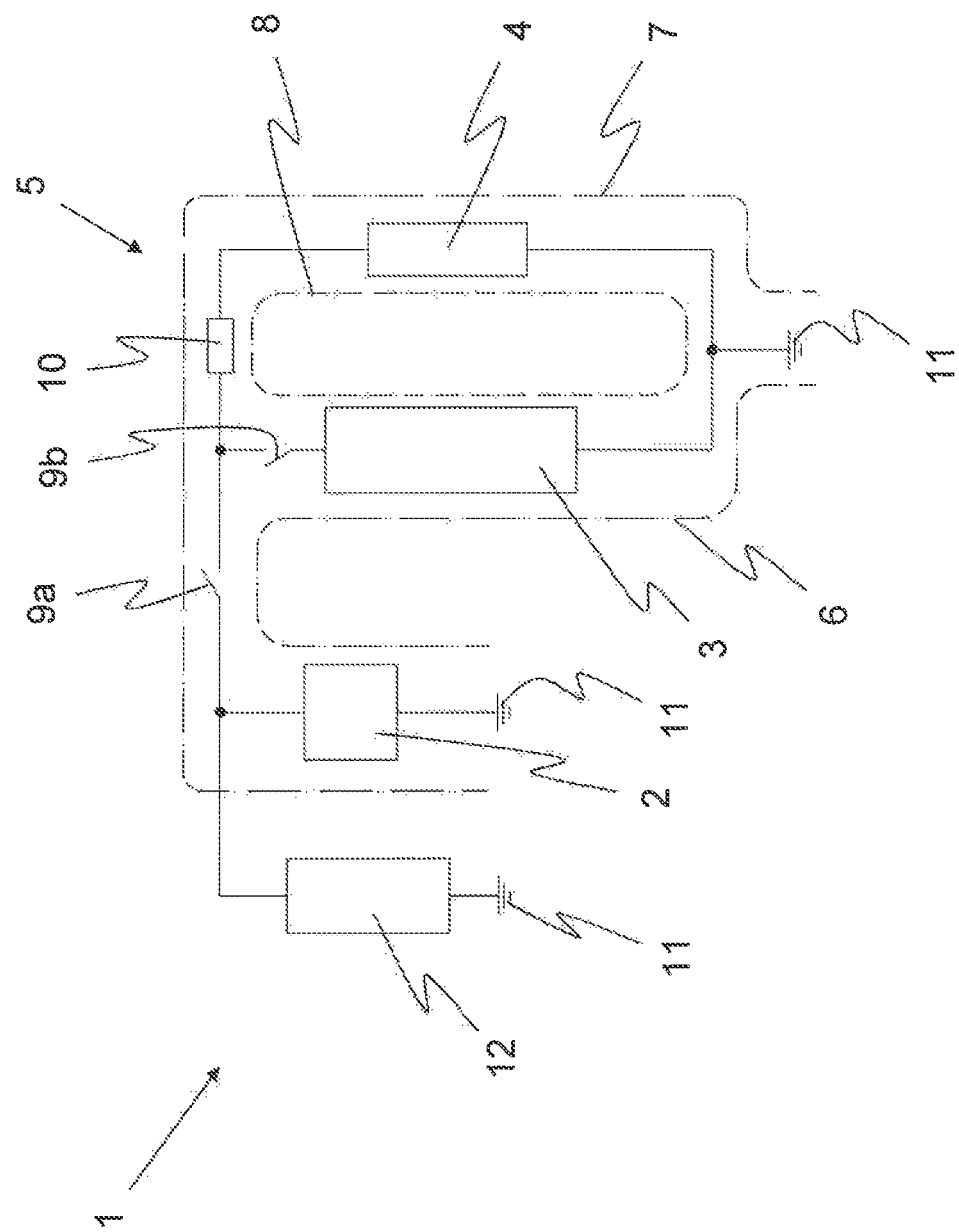

| | | |
|---|---|---|
| 6,603,392 B1 | 8/2003 | Ramm |
| 7,002,424 B2 | 2/2006 | Matsuo et al. |
| 7,330,083 B2 | 2/2008 | Matsuo et al. |
| 8,149,559 B2 | 4/2012 | Kakehi et al. |
| 8,594,346 B2 | 11/2013 | Kwan et al. |
| 9,462,395 B2 | 10/2016 | Nicollini et al. |
| 2010/0271147 A1* | 10/2010 | Leibman ............ H03F 3/217 331/160 |
| 2013/0082572 A1 | 4/2013 | Oshima et al. |
| 2013/0320954 A1 | 12/2013 | Capofreddi et al. |
| 2016/0277833 A1 | 9/2016 | Qin et al. |

FOREIGN PATENT DOCUMENTS

| | | |
|---|---|---|
| CN | 101689818 A | 3/2010 |
| CN | 204929254 U | 12/2015 |
| DE | 694 32 643 T2 | 4/2004 |
| DE | 10 2005 014929 A1 | 10/2006 |
| DE | 602 22 338 | 6/2008 |
| DE | 10 2011 051 570 | 1/2012 |
| EP | 2017902 | 1/2009 |
| EP | 2 924 868 | 9/2015 |
| WO | WO 2011/159346 A1 | 6/2011 |

OTHER PUBLICATIONS

International Search Report and Written Opinion of the Searching Authority, dated Nov. 27, 2017, 14 Pages.
Taiwanese Examination Report dated Apr. 16, 2021, 9 pages.
Chinese Search Report and Translation of 201780056700.4, dated Jun. 29, 2020, 15 Pages.
EPO Summons with Translation, dated Nov. 2, 2021, 18 pages.
CN Notification with Translation, dated Dec. 29, 2021, 6 pages.

* cited by examiner

METHOD AND CIRCUIT FOR OPERATING A PIEZOELECTRIC MEMS SOUND TRANSDUCER AND INTEGRATED CIRCUIT COMPRSING SUCH A CIRCUIT

The present invention relates to a method for operating a piezoelectric component designed as a MEMS sound transducer, in which electrical energy is stored in at least one energy store. The piezoelectric MEMS sound transducer is, in particular, a MEMS loudspeaker operating in the audible wavelength spectrum and/or in the ultrasonic range, and/or a MEMS microphone operating in the audible wavelength spectrum and/or in the ultrasonic range. The MEMS sound transducer can therefore be utilized, in particular, for sonic and/or ultrasonic applications. The MEMS sound transducer can be utilized, for example, in medical technology. The MEMS sound transducer can also be utilized, however, as a loudspeaker and/or microphone, in particular in mobile devices, such as headphones, mobile phones, or tablets. In the method, the electrical energy is transferred indirectly between the energy store and the piezoelectric component designed as a MEMS sound transducer with the aid of at least one transfer unit. Moreover, the invention relates to a circuit for operating the piezoelectric MEMS sound transducer, which includes an energy store, in which electrical energy can be stored. The energy is transferred between the energy store and the piezoelectric MEMS sound transducer with the aid of at least one transfer unit. Moreover, the invention relates to an integrated circuit including such a circuit.

DE 10 2013 109 098 A1 describes a piezoelectric driver which is configured for supplying electrical charge to a piezoelectric component and is configured for transferring electrical charge from the piezoelectric component to a passive energy storage component during various operating states of the piezoelectric driver. Moreover, the piezoelectric driver includes a voltage transformer, which is configured for acting as the electrical connection between a piezoelectric component and the first passive energy storage component and a second passive energy storage component. The voltage transformer is configured for supplying electrical charge from the first passive energy storage component and from the second passive energy storage component to the piezoelectric component, and vice versa. The disadvantage of this piezoelectric driver is that the voltage transformer can be operated ineffectively. This results in a high power loss, which must be removed from the circuit and from the piezoelectric driver as heat.

The problem addressed by the invention is therefore that of creating a method and a circuit for operating a piezoelectric component designed as a piezoelectric MEMS sound transducer, with the aid of which the piezoelectric MEMS sound transducer can be operated with a low power loss.

The problem is solved by a method and a circuit for operating a piezoelectric component designed as a piezoelectric MEMS sound transducer according to the features of the independent claims.

The invention relates to a method for operating a piezoelectric component, in which electrical energy is stored in at least one energy store. The piezoelectric component is designed as a piezoelectric MEMS sound transducer, in particular in the entire following description. A MEMS sound transducer of this type preferably comprises essentially one piezoelectric actuator and a diaphragm, which can be deflected by the actuator. The MEMS sound transducer is preferably a MEMS loudspeaker operating in the audible wavelength spectrum and/or in the ultrasonic range, and/or a MEMS microphone operating in the audible wavelength spectrum and/or in the ultrasonic range. The MEMS sound transducer is preferably utilized for sonic and/or ultrasonic applications, such as in medical technology. The MEMS sound transducer can also be utilized, however, as a MEMS loudspeaker and/or a MEMS microphone.

This electrical energy is transferred between the energy store and the piezoelectric component designed as a MEMS sound transducer indirectly via at least one transfer unit.

According to the invention, the at least one transfer unit and the piezoelectric component designed as a piezoelectric MEMS sound transducer are situated in a parallel circuit with respect to one another. The at least one transfer unit and the piezoelectric component designed as a piezoelectric MEMS sound transducer are connected in such a way that, in order to operate the piezoelectric component designed as a piezoelectric MEMS sound transducer, the at least one transfer unit is first of all charged from the energy store, in a first switching state. This transfer unit is then discharged again, in a second switching state, and the piezoelectric component designed as a piezoelectric MEMS sound transducer is charged in this case.

During a charging of the piezoelectric component designed as a piezoelectric MEMS sound transducer with electrical energy, it deflects, i.e., a deformation of the piezoelectric component designed as a piezoelectric MEMS sound transducer takes place. Sound waves, for example, can be generated with the aid of this deflection or deformation. The piezoelectric component designed as a piezoelectric MEMS sound transducer is therefore deflected with the aid of the second switching state.

Additionally or alternatively, in order to recover energy, in a third switching state, the piezoelectric component designed as a piezoelectric MEMS sound transducer is discharged again and the at least one transfer unit is charged in this case. This transfer unit then is discharged again, in a fourth switching state, and the energy store is charged in this case. During the discharge, the piezoelectric component designed as a piezoelectric MEMS sound transducer returns to an initial state. Due to the energy recovery, the piezoelectric component designed as a piezoelectric MEMS sound transducer can be operated more effectively.

Advantageously, the electrical energy can be stored, at least intermittently, in the at least one transfer unit.

In an advantageous enhanced embodiment of the invention, the electrical energy is transferred step-by-step between the energy store and the piezoelectric component designed as a piezoelectric MEMS sound transducer, and so the electrical energy is transferred in portions. The piezoelectric component designed as a piezoelectric MEMS sound transducer can have a capacitance, which is charged up to a certain end voltage with the aid of the method. Due to the step-by-step charging of the piezoelectric component designed as a piezoelectric MEMS sound transducer with electrical energy, the voltage is also increased step-by-step up to the end voltage. Due to the step-by-step charging, the power loss during the operation of the piezoelectric component designed as a piezoelectric MEMS sound transducer is reduced. The same applies for the discharging, or during the recovery of energy of the piezoelectric component designed as a piezoelectric MEMS sound transducer.

The step-by-step charging takes place in such a way that the first switching state and the second switching state are repeated again and again, so that a portion of energy is transferred to the piezoelectric component designed as a piezoelectric MEMS sound transducer during every cycle.

The charging of the piezoelectric component designed as a piezoelectric MEMS sound transducer can be carried out in such a way that the voltage at the piezoelectric component designed as a piezoelectric MEMS sound transducer is increased by a constant fraction of the end voltage during every charging step. Additionally or alternatively, the voltage can even be increased in different voltages up to the end voltage. For example, the voltage at the piezoelectric component designed as a piezoelectric MEMS sound transducer can be increased by $\frac{1}{1000}$ of the end voltage, so that 1000 charging steps are carried out in order to reach the end voltage at the piezoelectric component designed as a piezoelectric MEMS sound transducer. As a result, when the end voltage has been reached, a predefined deflection of the piezoelectric component designed as a piezoelectric MEMS sound transducer has also been reached.

With the aid of the step-by-step charging, a higher voltage can also be reached than is made available, for example, at the energy store. Since the voltage at the piezoelectric component designed as a piezoelectric MEMS sound transducer is proportional to an electrical charge on the piezoelectric MEMS sound transducer, and the piezoelectric component designed as a piezoelectric MEMS sound transducer is charged via the charging steps, the voltage can be further increased. This can also be carried out, for example, when the voltage supplied by the energy store is less than the instantaneous voltage at the piezoelectric component designed as a piezoelectric MEMS sound transducer. The method can therefore also be applied, for example, in order to generate a higher voltage at the piezoelectric component designed as a piezoelectric MEMS sound transducer using a lower voltage which is made available, for example, by the energy store.

In an advantageous enhanced embodiment of the invention, in order to operate the piezoelectric component designed as a piezoelectric MEMS sound transducer, the electrical energy is first of all at least partially transferred from the energy store, on a first current path, to the first transfer unit, in the first switching state. In a subsequent step, the electrical energy in a first circuit is at least partially transferred to the piezoelectric component designed as a piezoelectric MEMS sound transducer, in the second switching state. As a result, the circuit is loaded with a lower electric current, since only the first current path or the first circuit is loaded with a current. This process is repeated as often as necessary in order to reach the end voltage, for example, in 1000 charging steps. In order to carry out 1000 charging steps, the cycle of the charging of the at least one transfer unit and the subsequent transfer to the piezoelectric component designed as a piezoelectric MEMS sound transducer is carried out 1000 times. In so doing, the voltage of the piezoelectric component designed as a piezoelectric MEMS sound transducer is increased by $\frac{1}{1000}$ of the end voltage, for example, during every charging step. In addition, as a result, a correspondingly small amount of electrical energy is transferred from the energy store, via the first transfer unit, to the piezoelectric component designed as a piezoelectric MEMS sound transducer during every charging step, and so the involved electrical components, such as strip conductors, can be kept small, since correspondingly small amounts of energy are transferred. In addition, a charging of this type is highly effective, so that only a small amount of energy is lost or is converted to heat during the entire charging process.

Additionally or alternatively, in order to recover energy, the electrical energy of the piezoelectric component designed as a piezoelectric MEMS sound transducer is first of all transferred, in the first circuit, from the piezoelectric component designed as a piezoelectric MEMS sound transducer to the first transfer unit, in the third switching state, and is then transferred, on the first current path, to the energy store, in the fourth switching state. The energy recovery can likewise take place step-by-step, so that the power loss is likewise reduced during the discharge of the piezoelectric component designed as a piezoelectric MEMS sound transducer, since only a small amount of electrical energy is returned to the energy store during each discharge step. This can be carried out, for example, likewise in 1000 steps.

In an additional enhanced embodiment of the invention, it is advantageous when the electrical energy is transferred between the energy store and the piezoelectric component designed as a piezoelectric MEMS sound transducer with the aid of a second transfer unit, and so the piezoelectric component designed as a piezoelectric MEMS sound transducer is charged for operation and/or is discharged for energy recovery.

In this case, in order to operate the piezoelectric component designed as a piezoelectric MEMS sound transducer, the electrical energy is first of all transferred from the energy store, on a second current path through the at least one second transfer unit, to the at least one second transfer unit, in a fifth switching state. The electrical energy is then at least partially transferred, in at least one second circuit, from the second transfer unit to the piezoelectric component designed as a piezoelectric MEMS sound transducer, in a sixth switching state.

Additionally or alternatively, in order to recover energy, the electrical energy of the piezoelectric component designed as a piezoelectric MEMS sound transducer is first of all transferred, in the second circuit, from the piezoelectric component designed as a piezoelectric MEMS sound transducer to the second transfer unit, in a seventh switching state. The electrical energy on the second current path is then stored in the energy store, in an eighth switching state.

The fifth to eighth switching states of the second transfer unit can describe the same or a similar switching state as the first to fourth switching states. The further counting of the switching states was selected merely for the purpose of differentiating a possible other switching state. Essentially, the first and the fifth switching states result in a charging of the particular transfer units. The second and the sixth switching states result in a transfer of the energy from the particular transfer unit to the piezoelectric component designed as a piezoelectric MEMS sound transducer. The third and the seventh switching states result in a transfer of the energy from the piezoelectric component designed as a piezoelectric MEMS sound transducer back to the particular transfer unit in order to recover energy. The fourth and the eighth switching states result in a transfer of the energy from the particular transfer unit back into the energy store. The switching states which belong together, for example, the first and the fifth switching states, can be the same switching state.

The method can be carried out in a more flexible manner with the aid of the second transfer unit.

It is likewise advantageous when electrical energy is transferred from the energy store to the second transfer unit on the second current path during the transfer of the electrical energy, in the first circuit, from the first transfer unit to the piezoelectric component designed as a piezoelectric MEMS sound transducer.

Additionally or alternatively, it is advantageous when electrical energy is transferred, on the first current path, from the energy store to the first transfer unit and/or is stored therein during the transfer of the electrical energy, in the second circuit, from the second transfer unit to the piezoelectric component designed as a piezoelectric MEMS sound transducer.

As a result, the charging process of the piezoelectric component designed as a piezoelectric MEMS sound transducer can be shortened, since the energy is simultaneously transferred from a transfer unit to the piezoelectric component designed as a piezoelectric MEMS sound transducer and, at the same time, the particular other transfer unit is charged from the energy store.

The energy recovery can therefore likewise take place in parallel. For example, when the energy is transferred from the piezoelectric component designed as a piezoelectric MEMS sound transducer to the first transfer unit, energy which was previously stored from the piezoelectric component in the second transfer unit can be transferred to the energy store. As a result, the energy recovery can likewise be accelerated.

Additionally or alternatively, the energy can also be transferred from the piezoelectric component designed as a piezoelectric MEMS sound transducer to the second transfer unit and energy previously stored by the piezoelectric component in the first transfer unit can be transferred to the energy store.

Moreover, it is advantageous when the electrical energy in the energy store, the at least one transfer unit, and/or the at least one second transfer unit is increased in order to compensate for energy losses. The energy losses can be compensated for, in this case, with the aid of a power supply. The energy can be increased, for example, in an appropriate component whose energy is not being transferred at the moment.

Moreover, it is advantageous when the circuit comprises a plurality of switching units and/or switches which are opened and/or closed in order to form the various switching states, wherein the first current path, the second current path, the first circuit, and/or the second circuit are/is interrupted and/or become(s) conductive. As a result, the electrical energy is transferred to an appropriate component and a transfer of energy to the particular other components is prevented. Additionally or alternatively, the circuit can also comprise diodes, which are arranged in such a way that the current is blocked in one direction. For example, the first current path comprises a switching unit, which initially does not conduct the current, so that the first current path is interrupted. If this switching unit becomes conductive, the electrical energy can be transferred on the first current path. As a result, the energy is transferred between the energy store and the first transfer unit. The particular other switching units, switches, and/or diodes are switched and/or situated in such a way, in this case, that the energy is prevented from being transferred to another component. For example, the first circuit comprises a diode, which is situated in such a way that a current flow in the first circuit is prevented while the energy is being transferred to the first transfer unit on the first current path.

Moreover, the switching unit itself can comprise, for example, a diode and/or a switch. With the aid of the diode, a current flow can be blocked in one direction, so that, for example, although a current can flow from a transfer unit into the piezoelectric component designed as a piezoelectric MEMS sound transducer, the current flow from the piezoelectric component back into the transfer unit is blocked. For example, the diode can be bridged, at least intermittently, with the aid of a switch in order to also conduct the current, at least intermittently, counter to the diode (due to the bridging of the diode). This can be carried out, for example, in order to transfer the energy of the piezoelectric component to the transfer unit in the present example.

The switching units and/or the switches can be switched by a controller in this case.

Moreover, it is advantageous when the energy store and at least one first transfer unit and/or at least one second transfer unit can form an electrical, in particular resonant, oscillating circuit. Additionally or alternatively, at least one first and/or second transfer unit(s) and the piezoelectric component designed as a piezoelectric MEMS sound transducer can also form an electrical, in particular resonant, oscillating circuit. In this case, the switches and/or the switching units are preferably switched in such a way that the switching takes place in a current zero crossing of the particular oscillating circuit. As a result, the switches are switched when the electrical energy has been completely transferred.

Moreover, a circuit for operating a piezoelectric component designed as a piezoelectric MEMS sound transducer is provided, which comprises at least one energy store, in which electrical energy can be stored. Moreover, the circuit comprises a piezoelectric component. The piezoelectric component is designed as a piezoelectric MEMS sound transducer, in particular in the entire following description, A MEMS sound transducer of this type preferably comprises essentially one piezoelectric actuator and a diaphragm, which can be deflected by the actuator. The MEMS sound transducer is preferably a MEMS loudspeaker operating in the audible wavelength spectrum and/or in the ultrasonic range, and/or a MEMS microphone operating in the audible wavelength spectrum and/or in the ultrasonic range. The MEMS sound transducer is preferably utilized for sonic and/or ultrasonic applications, such as in medical technology. The MEMS sound transducer can also be utilized, however, as a MEMS loudspeaker and/or a MEMS microphone.

The circuit also comprises at least one transfer unit, with the aid of which the electrical energy can be transferred between the energy store and the piezoelectric component designed as a piezoelectric MEMS sound transducer.

According to the invention, the at least one transfer unit and the piezoelectric component designed as a piezoelectric MEMS sound transducer are situated in a parallel circuit with respect to one another. Moreover, the circuit can be operated according to at least one feature of the preceding description and/or the following description. Due to the parallel circuit, the transfer unit can be charged with electrical energy independently of the piezoelectric component designed as a piezoelectric MEMS sound transducer.

For example, the transfer unit can be charged in the first switching state with the aid of the parallel circuit in order to operate the piezoelectric component designed as a piezoelectric MEMS sound transducer. In this first switching state, the piezoelectric component designed as a piezoelectric MEMS sound transducer is not charged from this transfer unit and from the energy store. Not until a subsequent step, in the second switching state, is the electrical energy transferred from the transfer unit to the piezoelectric component designed as a piezoelectric MEMS sound transducer. As a result, the charging of the piezoelectric component designed as a piezoelectric MEMS sound transducer can be carried out more effectively.

The cycle, in which the transfer unit is charged from the energy store and the transfer unit then transfers the energy to the piezoelectric component, can be carried out multiple times. The cycle of the switching states takes place as follows. First of all, the first switching state takes place, in which the transfer unit is charged from the energy store. This is followed by the second switching state, so that the energy is transferred from the transfer unit to the piezoelectric component designed as a piezoelectric MEMS sound transducer. The cycle then begins once again in the first switching state and continues for as long as it takes for an entire amount of energy to be transferred to the piezoelectric component designed as a piezoelectric MEMS sound transducer. The effectiveness of the circuit can be increased as a result. In particular, the energy losses of the circuit decrease as a result.

As a result, a higher voltage can also be reached on the piezoelectric component designed as a piezoelectric MEMS sound transducer than is made available, for example, by the energy store. Due to the step-by-step charging, a charge of the piezoelectric component designed as a piezoelectric MEMS sound transducer can be increased. The charge on the piezoelectric component is proportional to the present voltage of the piezoelectric component in this case.

Additionally or alternatively, the energy recovery can also be carried out with the aid of a discharge cycle. In order to recover energy via the transfer unit, the circuit has a third switching state, in which the electrical energy is transferred from the piezoelectric component designed as a piezoelectric MEMS sound transducer to the transfer unit. The electrical energy is then transferred from the transfer unit to the energy store, in a fourth switching state.

Moreover, the circuit advantageously comprises a first current path, which extends through a first transfer unit, and a third current path, which extends through the piezoelectric component. The first current path and the third current path can be acted upon by an electric current independently of one another in this case. As a result, the electrical energy can be transferred from the energy store to the first transfer unit on the first current path. Due to the parallel circuit, a transfer of energy to the piezoelectric component designed as a piezoelectric MEMS sound transducer in this step can be prevented. Only thereafter can the energy be transferred from the first transfer unit to the piezoelectric component. As a result, the electrical energy can be initially transferred, in a first step, from the energy store to the first transfer unit, in the first switching state. Not until a subsequent step, in the second switching state, can the energy, which has been transferred to the first transfer unit, be transferred within the parallel circuit, or via the first circuit, to the piezoelectric component. This transfer of the energy initially to the first transfer unit and then to the piezoelectric component can be carried out in a plurality of steps, so that only a small amount of energy is transferred each time. An effectiveness of the circuit can be increased as a result. In this case, in particular, power losses, which are converted into heat and must be dissipated, are reduced. As a result, the circuit can be operated at lower cost. Due to the step-by-step transfer of the energy, the circuit can also be designed to be smaller and more compact, since less energy is therefore transferred in each step, and so the components are subjected to a lesser load. For example, low electric currents flow, so that, for example, strip conductors can be designed to be smaller.

For example, the transfer unit can be charged from the energy store in the first switching state, wherein the first current path is conductively connected in the first switching state.

For example, the energy can be transferred, on the first circuit, from the transfer unit to the piezoelectric component designed as a piezoelectric MEMS sound transducer, in the second switching state. The first circuit is conductively connected for this purpose. Additionally, the first current path can be interrupted.

For example, the energy for the energy recovery can be transferred, in the first circuit, from the piezoelectric component designed as a piezoelectric MEMS sound transducer to the first transfer unit, in the third switching state. The first circuit is conductively connected for this purpose. Additionally, the first current path can be interrupted, so that a current flow into the energy store is blocked.

For example, the energy for the energy recovery can be transferred, on the first current path, from the first transfer unit to the energy store, in the fourth switching state. The first current path is conductively connected in this case. Additionally, the first circuit can be interrupted, so that a current flow into the piezoelectric component designed as a piezoelectric MEMS sound transducer is blocked.

In an advantageous enhanced embodiment of the invention, the circuit comprises a second transfer unit, with the aid of which the electrical energy can be transferred between the energy store and the piezoelectric component designed as a piezoelectric MEMS sound transducer. The transfer of the energy can even take place in both directions in this case. The piezoelectric component can be charged for operation. The energy is transferred from the energy store to the second transfer unit and, from there, is transferred to the piezoelectric component. The piezoelectric component can be discharged for energy recovery. For this purpose, the energy can be transferred from the piezoelectric component to the second transfer unit and, from there, the energy can be transferred back into the energy store.

The second transfer unit and the piezoelectric component designed as a piezoelectric MEMS sound transducer are situated in a parallel circuit, so that an electric current can be applied to a second current path through the second transfer unit and to the third current path through the piezoelectric component, independently of one another. As a result, the energy can be initially transferred to the second transfer unit in a first step and, thereafter, to the piezoelectric component. As a result, the piezoelectric component designed as a piezoelectric MEMS sound transducer can be charged step-by-step, for example, in 1000 steps, and so the effectiveness of the operation of the piezoelectric component is increased.

The energy can be transferred from the energy store to the second transfer unit, for example, in a fifth switching state. The second current path is conductive in this case. In addition, a current in the second circuit is blocked, so that a current flow to the piezoelectric component designed as a piezoelectric MEMS sound transducer is prevented.

The energy can be transferred from the second transfer unit to the piezoelectric component designed as a piezoelectric MEMS sound transducer, for example, in a sixth switching state. The second current path is interrupted in this case, whereas the second circuit is conductive.

For example, the energy recovery can also be carried out here. For example, the energy can be transferred from the piezoelectric component designed as a piezoelectric MEMS sound transducer to the second transfer unit, in a seventh switching state. The second circuit is conductive in this case, whereas the second current path is blocked, so that a current flow to the energy store is prevented.

The energy can then be transferred from the second transfer unit to the energy store, for example, in an eighth switching state. The second current path is conductive in this case. The second circuit is blocked, so that a current flow into the piezoelectric component designed as a piezoelectric MEMS sound transducer is prevented.

It is likewise advantageous when the first transfer unit and the second transfer unit are situated in a parallel circuit, so that current can be applied to the first current path and the second current path independently of one another. As a result, the first transfer unit can be utilized separately from the second transfer unit for transferring energy.

It is also advantageous when the at least one first transfer unit and the piezoelectric component designed as a piezoelectric MEMS sound transducer are situated with respect to one another in such a way that a first circuit is formed. The first circuit therefore extends through the first transfer unit and through the piezoelectric component.

Additionally or alternatively, the second transfer unit and the piezoelectric component designed as a piezoelectric MEMS sound transducer can be situated with respect to one another in such a way that a second circuit is formed. The second circuit therefore extends through the second transfer unit and through the piezoelectric component.

With the aid of the first and/or the second circuit(s), a current can be limited to the particular circuit (i.e., the current is formed only in the particular circuit) during the transfer of the energy from the first or the second transfer unit to the piezoelectric component designed as a piezoelectric MEMS sound transducer. As a result, for example, components outside the first or the second circuit are not loaded.

Moreover, it is advantageous when the first transfer unit and/or the second transfer unit comprise(s) an energy storage unit, so that the electrical energy can be stored in the transfer units. The energy storage unit can comprise, for example, a coil, which has an inductance. The energy can be stored in the coil in a magnetic field in this case. The coil generates the magnetic field when an electric current flows through the coil and, therefore, on the first or the second current path. The coil can release the energy once again, so that it generates a current.

Moreover, it is advantageous when the energy store comprises a capacitor having a capacitance, so that the electrical energy can be stored therein. The capacitor can store the energy in an electrical field and release it again.

Moreover, it is advantageous when the energy store and the first and/or the second transfer unit(s) form an electrical oscillating circuit. Additionally or alternatively, the first and/or the second transfer unit(s) and the piezoelectric component designed as a piezoelectric MEMS sound transducer can also form an electrical oscillating circuit. As a result, the electrical energy stored in the electrical oscillating circuit can oscillate between the particular components. In this case, the oscillating circuit can be a resonant oscillating circuit, so that the energy can oscillate without an exciter.

It is also advantageous when the circuit comprises a power supply, with the aid of which an energy loss can be compensated for. In addition, the power supply is connected to the energy store, to the first transfer unit, and/or to the second transfer unit, so that the energy loss can be compensated for by increasing the electrical energy in the energy store, in the first transfer unit, and/or in the second transfer unit. The power supply can be electrically connected, for example, to the energy store, so that the energy in the energy store can be compensated for with the aid of an electric current. Additionally or alternatively, the power supply can also be magnetically connected, for example, to a transfer unit. When a transfer unit comprises a coil, for example, energy can be fed into the coil with the aid of an alternating magnetic field according to a transformer principle.

In an advantageous enhanced embodiment of the invention, the circuit comprises a controller and a plurality of switching units and/or switches and/or diodes, so that the particular switching states can be formed, wherein the switching units and/or switches can be activated with the aid of the controller in such a way that the first current path, the second current path, the third current path, the first circuit, and/or the second circuit can be interrupted or made to be conductive. As a result, an electric current in the particular current paths and/or circuits can be interrupted. Additionally or alternatively, the particular current path and/or circuit can also be conductively connected once again. The switches and/or switching units can comprise, for example, transistors, such as bipolar transistors and/or field effect transistors. The transistors are switched with the aid of the controller, so that, for example, a sound having a frequency of 1000 Hz can be generated. The controller switches the switches in such a way that the piezoelectric component designed as a piezoelectric MEMS sound transducer executes one period of the sound in 1 ms ($\frac{1}{1000}$ Hz). In this case, the piezoelectric component is completely charged and subsequently discharged once in this 1 ms. The charging can be carried out, for example, in a half period, i.e., in 0.5 ms, When the charging is carried out in 1000 steps, the controller switches the switches at a frequency of 2 MHz. The controller can also activate the switches at a higher frequency. For example, the controller can also activate the switches at 500 MHz when a higher sound frequency is to be generated and/or more charging steps are to be carried out.

Additionally or alternatively, the charging can even last longer than the discharging of the piezoelectric component designed as a piezoelectric MEMS sound transducer. For example, the charging can amount to 75% and the discharging can amount to 25% of a charge-discharge cycle.

It is also advantageous when the switching units comprise at least one switch and/or diode, which can interrupt the electric current optionally in both directions and/or in one direction and/or can allow the electric current to flow in both directions, so that a flow of the electrical energy into and/or out of the piezoelectric component designed as a piezoelectric MEMS sound transducer can be controlled. If the switching unit is situated, for example, in an oscillating circuit and blocks the current in one direction, the current can oscillate in only one direction. The electrical energy, which oscillates in the oscillating circuit, for example, between the transfer unit and the piezoelectric component, can oscillate only from the transfer unit onto the piezoelectric component. For example, the diode in the switching unit prevents the energy from oscillating back again. In order to transfer the energy from the piezoelectric component back to this transfer unit, the switching unit can be activated, for example, with the aid of the controller, in order to switch, for example, from the state in which the switching unit blocks in one direction, for example, with the aid of a diode, into a state in which the switching unit conducts the current in both directions. The diode in the switching unit can be bridged, for example, briefly. The switching unit can be situated, for example, in the first circuit, in the second circuit, in the third circuit, in the first and/or in the second circuit(s).

Moreover, an integrated circuit is provided, which encompasses a circuit, which is designed according to at least one of the features of the preceding description and/or the following description. The integrated circuit can be, for example, an ASIC.

Figure 2:
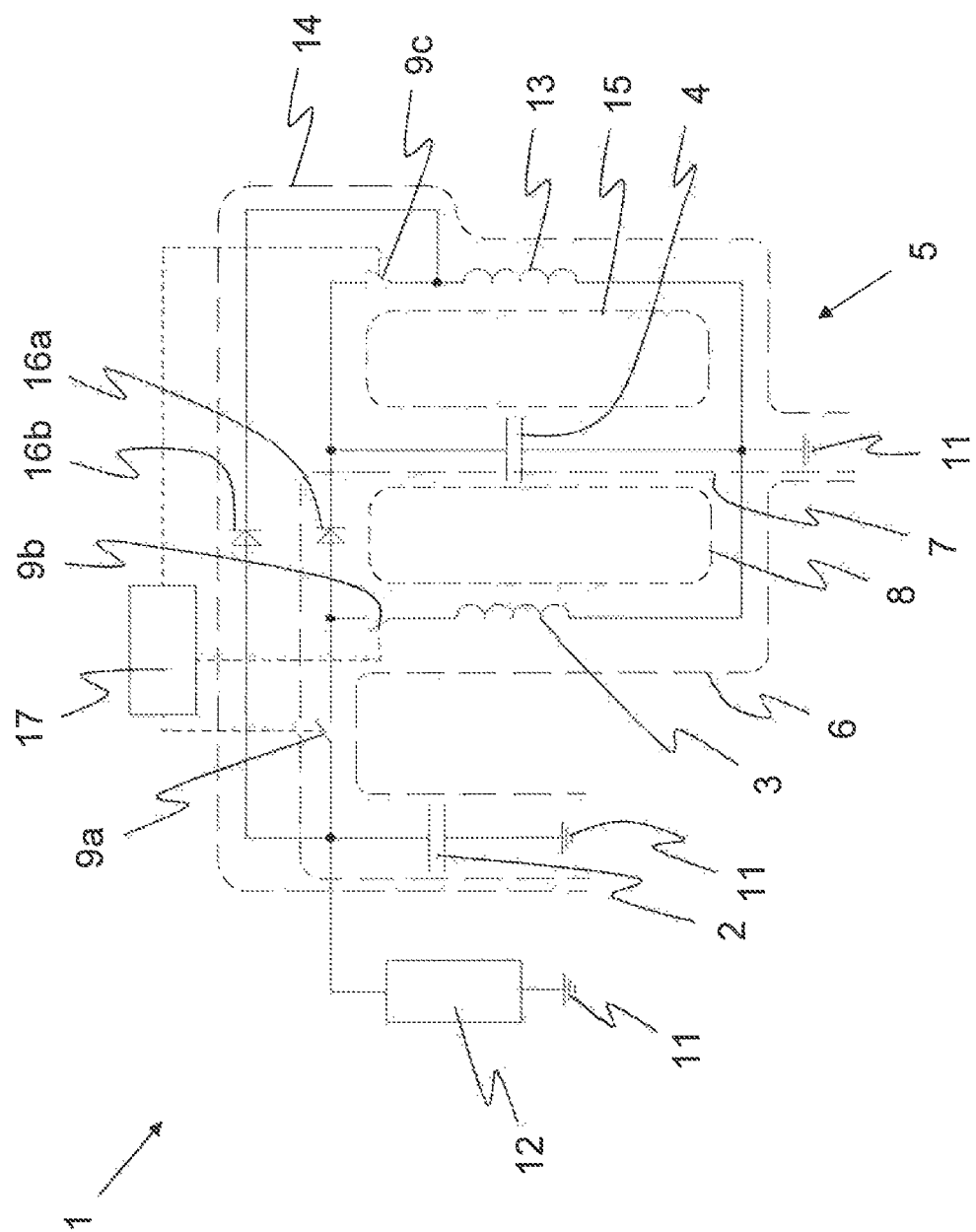
Figure 3:
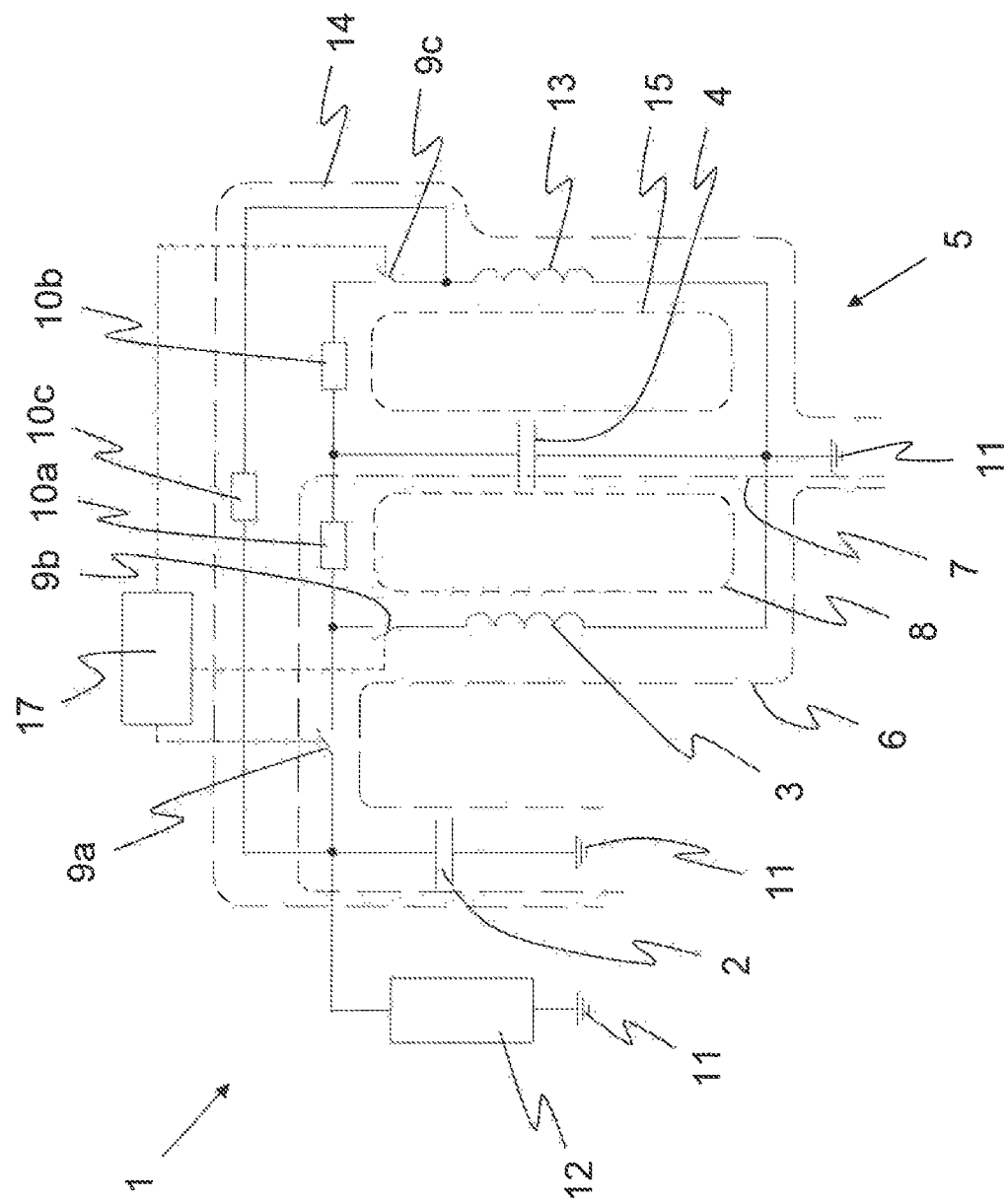

Further advantages of the invention are described in the following exemplary embodiments. Wherein:

FIG. 1 shows a block diagram of a circuit for operating a piezoelectric component designed as a piezoelectric MEMS sound transducer, comprising an energy store, a transfer unit, and a piezoelectric component designed as a piezoelectric MEMS sound transducer, FIG. 2 shows a block diagram of a circuit for operating a piezoelectric component designed as a piezoelectric MEMS sound transducer, comprising an energy store and two transfer units, and FIG. 3 shows a block diagram of an alternative circuit for operating a piezoelectric component designed as a piezoelectric MEMS sound transducer, comprising an energy store and two transfer units.

A piezoelectric component designed as a piezoelectric MEMS sound transducer 4 is shown in the following figures. A MEMS sound transducer 4 of this type preferably comprises essentially one piezoelectric actuator and a diaphragm, which can be deflected by the actuator. The MEMS sound transducer 4 is preferably a MEMS loudspeaker operating in the audible wavelength spectrum and/or in the ultrasonic range, and/or a MEMS microphone operating in the audible wavelength spectrum and/or in the ultrasonic range. The MEMS sound transducer is preferably utilized for sonic and/or ultrasonic applications, such as in medical technology. The MEMS sound transducer can also be utilized, however, as a MEMS loudspeaker and/or MEMS microphone, for example, in mobile devices, such as mobile phones or tablets.

FIG. 1 shows a block diagram of a circuit 1 for operating a piezoelectric MEMS sound transducer 4, comprising an energy store 2, a transfer unit 3, and a piezoelectric MEMS sound transducer 4, The piezoelectric MEMS sound transducer 4 can be preferably utilized for sonic and/or ultrasonic applications, such as in medical technology. The piezoelectric MEMS sound transducer 4 can also be utilized, however, for sound systems, for example headphones, as loudspeakers and/or microphones.

The piezoelectric MEMS sound transducer 4 has the property of deforming when charged with electrical energy, i.e., a deflection of the piezoelectric MEMS sound transducer 4 is induced, in particular a deflection of an actuator, which is coupled to a diaphragm which can therefore be made to vibrate. In particular, the piezoelectric MEMS sound transducer 4, and, in particular, its piezoelectric actuator, deflects when charged with electrical charges. Depending on an amplitude and/or a frequency of the deflection, sound waves having a sound amplitude and/or a sound frequency can be generated as a result.

The piezoelectric MEMS sound transducer 4 can also have a capacitance. The piezoelectric MEMS sound transducer 4 is charged with electrical charges in this case, and so the electrical energy is stored in an electrical field. The piezoelectric MEMS sound transducer 4 therefore has properties similar to those of a capacitor.

In order to make the electrical energy available for the piezoelectric MEMS sound transducer 4, the circuit 1 comprises the energy store 2, in which the electrical energy can be stored.

Moreover, the circuit 1 comprises a transfer unit 3, with the aid of which the electrical energy can be transferred between the energy store 2 and the piezoelectric MEMS sound transducer 4. The transfer of the electrical energy can take place in both directions. In order to operate the piezoelectric MEMS sound transducer 4, the transfer unit 3 can transfer the electrical energy from the energy store 2 to the piezoelectric MEMS sound transducer 4, so that the piezoelectric MEMS sound transducer 4 is charged. Due to the charging of the piezoelectric MEMS sound transducer 4, the piezoelectric MEMS sound transducer 4—i.e., its piezoelectric actuator and/or actuator structure—is deflected, and so sound waves can be generated.

In order to recover energy, the transfer unit 3 can transfer the electrical energy from the piezoelectric MEMS sound transducer 4 back to the energy store 2, so that the electrical energy is stored there once again. Due to the energy recovery, the circuit can be operated at lower cost and more effectively.

Moreover, the at least one transfer unit 3 and the piezoelectric MEMS sound transducer 4 are situated in a parallel circuit 5 with respect to one another. With the aid of the parallel circuit 5, a current can be applied to a first current path 6, which extends from the energy store 2 through the at least one transfer unit 3, and to a third current path 7, which extends from the energy store 2 through the piezoelectric MEMS sound transducer 4, independently of one another. The current paths 6, 7 are closed via ground 11.

Due to the parallel arrangement of the at least one transfer unit 3 and the piezoelectric MEMS sound transducer 4, the energy can be used first of all to charge the transfer unit 3 in a first step. Due to the parallel circuit 5, a current flow on the third current path 7 can be prevented. A charging of the piezoelectric MEMS sound transducer 4 in this step is therefore prevented. The energy transferred to the transfer unit 3 can then be transferred to the piezoelectric MEMS sound transducer 4 with the aid of a circuit 8. It is advantageous that the piezoelectric MEMS sound transducer 4 can be charged in multiple individual steps. After the energy has been transferred from the transfer unit 3 to the piezoelectric MEMS sound transducer 4, energy can be transferred to the transfer unit 3 again, in an additional step. This energy is then transferred once again to the piezoelectric MEMS sound transducer 4, which is now already partially charged. The piezoelectric MEMS sound transducer 4 is charged with the aid of portions of energy for as long as it takes for a desired total amount of energy to be stored on the piezoelectric MEMS sound transducer 4. When the total amount of energy on the piezoelectric MEMS sound transducer 4 has been reached, an end point of the deflection of the piezoelectric MEMS sound transducer 4 has been reached. Since the piezoelectric MEMS sound transducer 4 has capacitance, the piezoelectric MEMS sound transducer 4 is charged with a certain amount of electrical charge. The piezoelectric MEMS sound transducer 4 is therefore charged to a certain end voltage.

It is also advantageous that a higher voltage can be reached on the piezoelectric MEMS sound transducer 4, with the aid of the circuit, by utilizing a voltage made available by the energy store 2. Due to the step-by-step charging, the voltage of the piezoelectric MEMS sound transducer 4 can be increased step-by-step, beyond the voltage at the energy store 2.

When the piezoelectric MEMS sound transducer 4 has been charged to the total energy level, i.e., the end voltage, this state can be maintained for a period of time, so that the piezoelectric MEMS sound transducer 4 remains deflected. Only thereafter can the energy of the piezoelectric MEMS sound transducer 4 be recovered. Alternatively, the energy can also be recovered immediately after the total energy level has been reached.

In order to apply an electric current to the first current path 6 independently of the third current path 7, the circuit 1 in the exemplary embodiment shown here comprises two switches 9a, 9b and one switching unit 10. The switches 9a, 9b can be designed, for example, as transistors, in particular as bipolar transistors and/or as field effect transistors. Moreover, the switching unit 10 can comprise a diode and/or a further switch. With the aid of the switching unit 10, the current can be optionally conducted through in only one direction, conducted through in both directions, or can be blocked in both directions.

In order to form a first switching state and, in the first step, transfer the electrical energy from the energy store 2 to the at least one transfer unit 3 on the first current path 6, the two switches 9a and 9b are closed, so that the switches 9a and 9b conduct the current through. The switching unit 10 is switched in such a way, in this case, that a current flow through the switching unit 10 and, therefore, on the third current path 7, is prevented. This can be achieved, for example, with the aid of a diode, which prevents the current from the energy store 2 from flowing into the piezoelectric MEMS sound transducer 4. Additionally or alternatively, a switch can also be situated in the switching unit 10, which is open, so that the third current path 7 is interrupted.

Via the switches 9a and 9b, the energy is transferred from the energy store 2 to the transfer unit 3 on the first current path 6. It is possible for only a fraction of the total amount of energy, which is to be transferred to the piezoelectric MEMS sound transducer 4, to be transferred to the transfer unit 3 in this case.

If the energy has been transferred to the transfer unit 3, the switch 9a is opened, so that the first current path 6 is interrupted. The switch 9b remains closed, i.e., conductive. Now the second switching state can be formed. The energy transferred to the transfer unit 3 can now be transferred to the piezoelectric MEMS sound transducer 4 in the first circuit 8. The switching unit 10 can be switched in such a way, in this case, that it conducts the energy through to the piezoelectric MEMS sound transducer 4 in at least one direction. The switching unit 10 can comprise a diode which allows the energy to pass to the piezoelectric MEMS sound transducer. If the energy has been transferred from the transfer unit 3 to the piezoelectric MEMS sound transducer 4, the switch 9b can be opened, for example, so that the circuit 8 is interrupted. Additionally or alternatively, a diode can also be situated in the switching unit 10, so that the energy can be transferred to the piezoelectric MEMS sound transducer 4, but a transfer of the energy from the piezoelectric MEMS sound transducer 4 back to the first transfer unit 3 is prevented.

This process of transferring energy from the energy store 2 to the piezoelectric MEMS sound transducer 4 can be repeated until the total energy level, i.e., a total charge, on the piezoelectric MEMS sound transducer 4 has been reached. The energy, i.e., the charge, is increased step-by-step, i.e., in portions, on the piezoelectric MEMS sound transducer 4. As a result, a power loss in the circuit 1 is reduced. This results in less waste heat, and so the circuit 1 can be designed to be more compact and more effective.

The switch 9b can be closed in order to recover the energy from the piezoelectric MEMS sound transducer 4 in a third switching state. The switch 9a is opened, so that a current flow into the energy store 2 is prevented, In addition, the switching unit 10 can conduct the electrical energy from the piezoelectric MEMS sound transducer 4 through to the transfer unit 3. As a result, the energy is transferred, in the first circuit 8, from the piezoelectric MEMS sound transducer 4 back to the transfer unit 3. If the energy has been transferred to the transfer unit 3, a switch situated in the switching unit 10, for example, can be opened, so that a flow of the energy back into the piezoelectric MEMS sound transducer 4 is prevented. The return flow of the energy can also be achieved with the aid of a diode in the switching unit 10, however.

In a fourth switching state, the energy stored in the transfer unit 3 can be transferred to the energy store 2. For this purpose, the switch 9a is closed, so that the first current path 6 becomes conductive. The switch 9b is likewise closed. The energy is therefore returned back to the energy store 2.

In order to recover energy, the third and the fourth switching states can be repeated until the total amount of energy has been returned to the energy store 2.

In order to compensate for energy losses in the circuit 1, the circuit 1 comprises a power supply 12, with the aid of which the energy losses can be compensated for. In this exemplary embodiment, the power supply 12 can increase the energy in the energy store 2, so that the energy losses are compensated for.

FIG. 2 shows a block diagram of an alternative circuit 1 for operating a piezoelectric component designed as a MEMS sound transducer 4. The circuit 1 comprises the piezoelectric component designed as a MEMS sound transducer 4, an energy store 2, a first transfer unit 3, and a second transfer unit 13.

In addition to the first transfer unit 3, which is situated in a parallel circuit 5 with the piezoelectric MEMS sound transducer 4, the circuit 1 comprises the second transfer unit 13. The second transfer unit 13 is likewise situated in a parallel circuit 5 with the piezoelectric MEMS sound transducer 4. Moreover, the second transfer unit 13 is situated in parallel to the first transfer unit 3. Due to the parallel arrangement of the two transfer units 3, 13 and the piezoelectric MEMS sound transducer 4, a current can be applied to the particular components 3, 4, 13 independently of one another. A second current path 14 extends from the energy store 2 to the second transfer unit 13. For example, current can be applied to the first current path 6 by the first transfer unit 3 independently of current being applied to the second current path 14 by the second transfer unit 13. As a result, the operation of the piezoelectric MEMS sound transducer 4 can be carried out in a more flexible manner.

Moreover, the first transfer unit 3 and the second transfer unit 13 each comprise a coil having an inductance. As a result, the electrical energy can be stored, at least intermittently, in the form of a magnetic field in the transfer units 3, 13.

In addition, the energy store 2 comprises a capacitor having a capacitance, in which the electrical energy can be stored in the form of an electrical field.

The piezoelectric MEMS sound transducer 4 is represented as a capacitor in this FIG. 2, since the piezoelectric MEMS sound transducer 4 essentially has the electrical properties of a capacitor.

The capacitor of the energy store 2, the capacitance of the piezoelectric MEMS sound transducer 4, and the coil of the transfer units 3, 13 form, with respect to one another (only the capacitor-coil pairs in each case, of course), an electrical oscillating circuit, in which the energy is capable of oscillating between the components.

In order to operate the piezoelectric MEMS sound transducer 4, the energy stored in the energy store 2 is now to be transferred step-by-step to the piezoelectric MEMS sound transducer 4. Since the energy store 2 is designed as a capacitor, the energy store 2 has a voltage when electrical energy is stored therein. The voltage of the energy store 2 can induce a current in the first current path 6 when the switches 9a, 9b are closed (all switches 9a-9c are open at the beginning). The first switching state is formed. Moreover, a diode 16a is situated in the circuit 1, which prevents a current on the third current path 7 from flowing through the piezoelectric MEMS sound transducer 4 or through the second transfer unit 13. This is an advantage of the parallel circuit 5, whereby a current can be applied only to the first current path 6 independently of the other current path.

Since the energy store 2 comprises a capacitor and the at least one first transfer unit 3 comprises a coil, they form an electrical oscillating circuit, and so the electrical energy in the first current path 6 oscillates between the energy store 2 and the first transfer unit 3. The oscillating circuit is also a resonant oscillating circuit.

When the electrical energy has been transferred from the energy store 2 to the transfer unit 3, wherein the electrical energy is stored in the magnetic field, the switch 9a is opened. As a result, the oscillating circuit is interrupted, so that no energy can be transferred between the energy store 2 and the first transfer unit 3. The switch 9b remains closed. The second switching state is now formed.

Since the switch 9b remains closed, the circuit 8 is closed, and so the energy stored in the first transfer unit 3, i.e., in the coil, can be transferred to the piezoelectric MEMS sound transducer 4. The coil of the first transfer unit 3 and the capacitance of the piezoelectric MEMS sound transducer 4 likewise form an electrical, in particular resonant, oscillating circuit. The energy is therefore transferred from the coil to the piezoelectric MEMS sound transducer 4 with the aid of a current in the first circuit 8. The diode 16a is oriented in such a way that a current from the transfer unit 3 is conducted through to the piezoelectric MEMS sound transducer 4, but a current flow from the piezoelectric MEMS sound transducer 4 back to the transfer unit 3 is blocked. The energy therefore remains stored in the piezoelectric MEMS sound transducer 4, wherein the piezoelectric MEMS sound transducer 4, i.e., its actuator as well as the diaphragm coupled thereto, deflects.

It is possible for only a fraction of a total amount of energy required for the operation of the piezoelectric MEMS sound transducer 4 to be transferred to the piezoelectric MEMS sound transducer 4 with the aid of the aforementioned method. For example, only 1/1000 of the total amount of energy has been transferred to the piezoelectric MEMS sound transducer 4.

One advantage of the parallel circuit 5 is that, in a further step, energy is transferred once again from the energy store 2 to the first transfer unit 3 by closing the switch 9a once more, The first switching state is established again in this case. Energy has not yet been transferred to the piezoelectric MEMS sound transducer 4 in this case, however. When the energy has been transferred to the first transfer unit 3, the switch 9a is opened, so that the energy stored in the first transfer unit 3 is transferred to the piezoelectric MEMS sound transducer 4. The circuit 1 is now in the second switching state again. There are now, for example, two fractions (for example, 2 times 1/1000) of the total energy in the piezoelectric MEMS sound transducer 4. Alternatively, twice the amount of charge can also be present on the piezoelectric MEMS sound transducer 4.

This process can be carried out for as long as it takes for the total amount of energy to be transferred to the piezoelectric MEMS sound transducer 4 and for a desired deflection of the piezoelectric MEMS sound transducer 4 to have been achieved.

In order to recover the energy stored in the piezoelectric MEMS sound transducer 4, so that the circuit 1 can be operated at lower cost and more effectively, in this exemplary embodiment, after the deflection of the piezoelectric MEMS sound transducer 4, the energy can be transferred to the energy store 2 with the aid of the second transfer unit 13.

In this exemplary embodiment, a coil is likewise situated in the second transfer unit 13, so that the piezoelectric MEMS sound transducer 4 and the second transfer unit 13 likewise form an, in particular resonant, oscillating circuit. The second circuit 15 is closed by closing the switch 9c, so that the energy is transferred from the piezoelectric MEMS sound transducer 4 to the second transfer unit 13. A seventh switching state is now formed. The switch 9b can be opened, so that the first circuit 8 is interrupted in order to prevent a transfer of the energy to the first transfer unit 3. Additionally or alternatively, the diode 16a can also prevent the current from flowing into the first transfer unit 3.

When the energy has been transferred to the second transfer unit 13, the switch 9c is opened, so that the energy is transferred back to the energy store 2 via the second current path 14. An eighth switching state is now formed. The process of recovering energy can likewise be carried out in a plurality of steps, so that, in each case, only a fraction of the total energy of the piezoelectric MEMS sound transducer 4 is transferred to the energy store 2.

The numbering of the switching states is to be noted here. For example, the seventh switching state merely describes that the energy is transferred from the piezoelectric MEMS sound transducer 4 to the second transfer unit 13. The numbering was selected merely in order to differentiate the switching state in which the energy is transferred from the piezoelectric MEMS sound transducer 4 to the first transfer unit 3, from the switching state in which the energy is transferred from the piezoelectric MEMS sound transducer 4 to the second transfer unit 13. The seventh switching state does not mean that six other switching states must be implemented.

In order to switch the switches 9a-9c, the circuit 1 comprises a controller 17, with the aid of which the switches 9a-9c can be switched.

The desired sound waves can also be generated with the aid of the controller 17 and the switching of the switches 9a-9c. For example, a sound having a frequency of 1000 Hz is to be generated. Therefore, one period of the sound is 1 ms (1/1000 Hz) long. This means, the piezoelectric MEMS sound transducer 4 is to be charged within, for example, 0.5 ms. The remaining 0.5 ms can be utilized for the energy recovery. Moreover, if the piezoelectric MEMS sound transducer 4 is to be charged with the aid of 1000 charging steps, one charging step lasts for 0.5 μs, or 500 ns. This means, therefore, that the controller 17 must switch the switches 9a-9c at a frequency of 2 MHz. The controller 17 can also switch the switches 9a-9c even faster when, for example, more charging steps are to be carried out and/or a sound having a higher frequency is to be generated. The controller can activate the switches, for example, at a frequency of 500 MHz.

FIG. 3 shows a block diagram of an alternative circuit 1 for operating a piezoelectric component designed as a MEMS sound transducer 4. In addition to the piezoelectric MEMS sound transducer 4, the circuit also comprises an energy store 2 and two transfer units 3, 13.

The operation of the piezoelectric MEMS sound transducer 4 can be carried out here in parallel with the two transfer units 3, 13. For example, first of all, the energy can be transferred from the energy store 2 to the first transfer unit 3, in the first switching state, for the purpose of which the two switches 9a, 9b are closed. After the switch 9b is opened in the second switching state, the energy in the first circuit 8 can be transferred from the first transfer unit 3 to the piezoelectric MEMS sound transducer 4. A switching unit 10a is situated in the first circuit 8, which can comprise, for example, a diode, with the aid of which the return flow of energy from the piezoelectric MEMS sound transducer 4 to the first transfer unit 3 can be prevented. In addition, the switching unit 10a can also comprise at least one switch, so that the first circuit 8 can be interrupted. With the aid of the switching unit 10a, a current can also be conducted through in both directions.

It is advantageous when electrical energy is transferred, in a fifth switching state, from the energy store 2 to the second transfer unit 13 while the energy is being transferred from the first transfer unit 3 to the piezoelectric MEMS sound transducer 4. In this case, the energy flows via the second current path 14 to the second transfer unit 13. The second current path 14 comprises a switching unit 10c which can include a diode and/or at least one switch, so that the current can flow in both directions, in only one direction, and/or in neither direction. The switching unit 10c is switched in such a way, in this case, that a return flow of the energy to the energy store 2 is prevented after the energy has been transferred to the second transfer unit 13. When energy has been transferred to the second transfer unit 13, this energy can be transferred from there, in a sixth switching state, to the piezoelectric MEMS sound transducer 4 via the second circuit 15. A switching unit 10b is situated in the second circuit 15, which can comprise, for example, a diode and/or at least one switch, with the aid of which the return flow of energy from the piezoelectric MEMS sound transducer 4 to the second transfer unit 3 can be prevented. With the aid of the switching unit 10b, the current can also be conducted through in both directions, and/or the current can be blocked in both directions. The transfer of energy from the second transfer unit 13 to the piezoelectric MEMS sound transducer 4 in the sixth switching state can be carried out, for example, while energy is transferred to the first transfer unit 3 from the energy store 2 in the first switching state. Additionally or alternatively, energy can also be simultaneously transferred from the energy store 2 to the first transfer unit 3 in the first switching state, and to the second transfer unit 13 in the fifth switching state. Likewise additionally or alternatively, the first transfer unit 3 and the second transfer unit 13 can also simultaneously transfer the energy to the piezoelectric MEMS sound transducer 4. Due to a parallel and/or temporally staggered transfer of the energies to the two transfer units 3, 13 and to the piezoelectric MEMS sound transducer 4, the transfer can be carried out faster.

Additionally or alternatively, the parallel and/or temporally staggered transfer of the energy can also be carried out for energy recovery. For example, the energy can be transferred from the piezoelectric MEMS sound transducer 4 to both transfer units 3, 13. The energy can then be simultaneously transferred from the two transfer units 3, 13 into the energy store 2. The energy recovery can therefore likewise be carried out faster.

The present invention is not limited to the represented and described exemplary embodiments. Modifications within the scope of the claims are also possible, as is any combination of the features, even if they are represented and described in different exemplary embodiments.

LIST OF REFERENCE CHARACTERS

1 circuit
2 energy store
3 first transfer unit
4 piezoelectric MEMS sound transducer
5 parallel circuit
6 first current path
7 third current path
8 first circuit
9 switch
10 switching unit
11 ground
12 power supply
13 second transfer unit
14 second current path
15 second circuit
16 diode
17 controller

The invention claimed is:

1. A method for operating a piezoelectric MEMS sound transducer operating in the audible wavelength spectrum and/or in the ultrasonic range, wherein a transfer unit is available to transfer electrical energy between an energy store and the piezoelectric MEMS sound transducer and the transfer unit and the piezoelectric MEMS sound transducer are connected in a parallel circuit with respect to one another, the method comprising the following steps: in order to operate the piezoelectric MEMS sound transducer in a first switching state, the transfer unit is first of all charged from the energy store and this transfer unit is then discharged again in a second switching state and the piezoelectric MEMS sound transducer is charged in this case and in order to recover energy in a third switching state, the piezoelectric MEMS sound transducer is discharged again and the transfer unit is charged in this case, and this transfer unit is then discharged again in a fourth switching state and the energy store is charged in this case; and wherein the electrical energy in the energy store is increased in order to compensate an energy loss.

2. The method as claimed in claim 1, wherein the electrical energy is transferred step-by-step between the energy store and the piezoelectric MEMS sound transducer, and so the electrical energy is transferred in portions.

3. A method for operating a piezoelectric MEMS sound transducer operating in the audible wavelength spectrum and/or in the ultrasonic range, wherein a transfer unit is available to transfer electrical energy between an energy store and the piezoelectric MEMS sound transducer and the transfer unit and the piezoelectric MEMS sound transducer are connected in a parallel circuit with respect to one another, the method comprising the following steps:

in order to operate the piezoelectric MEMS sound transducer in a first switching state, the transfer unit is first of all charged from the energy store and this transfer unit is then discharged again in a second switching state and the piezoelectric MEMS sound transducer is charged in this case and in order to recover energy in a third switching state, the piezoelectric MEMS sound transducer is discharged again and the transfer unit is charged in this case, and this transfer unit is then discharged again in a fourth switching state and the energy store is charged in this case, wherein in order to operate the piezoelectric MEMS sound transducer, the electrical energy is first of all at least partially transferred from the energy store, on a first current path, to the first transfer unit, in the first switching state, and the electrical energy is then at least partially transferred, in a first circuit, from the first transfer unit to the piezoelectric MEMS sound transducer, in the second switching state, and/or, in order to recover energy, the electrical energy of the piezoelectric MEMS sound transducer is first of all transferred, in the first circuit, from the piezoelectric MEMS sound transducer to the first transfer unit, in the third switching state, and is then transferred, on the first current path, to the energy store, in the fourth switching state.

4. The method as claimed in claim 1, wherein in the method, the electrical energy is transferred between the energy store and the piezoelectric MEMS sound transducer with the aid of a second transfer unit and, in order to operate the piezoelectric MEMS sound transducer, the electrical energy is first of all at least partially transferred from the energy store, on at least one second current path, to the second transfer unit, in a fifth switching state, and the electrical energy is then at least partially transferred, in a second circuit, from the second transfer unit to the piezoelectric MEMS sound transducer, in a sixth switching state, and/or in order to recover energy, the electrical energy of the piezoelectric MEMS sound transducer is first of all transferred, in the second circuit, from the piezoelectric MEMS sound transducer to the second transfer unit, in a seventh switching state, and is then transferred, on the second current path, to the energy store, in an eighth switching state.

5. The method as claimed in claim 1, wherein electrical energy is transferred, on the second current path, from the energy store to the second transfer unit during the transfer of the electrical energy, in the first circuit, from the first transfer unit to the piezoelectric MEMS sound transducer and/or electrical energy is transferred, on the first current path, from the energy store to the first transfer unit during the transfer of the electrical energy, in the second circuit, from the second transfer unit to the piezoelectric MEMS sound transducer.

6. The method as claimed in claim 1, wherein the circuit comprises a plurality of switching units and/or switches which are opened and/or closed in such a way, and/or comprises a plurality of diodes which are situated in such a way that the various switching states can be formed, wherein the first current path, the second current path, the first circuit, and/or the second circuit are/is interrupted and/or made to be conductive or are/is conductive, and so the electrical energy can be transferred between the energy store, the first transfer unit, the second transfer unit, and/or the piezoelectric MEMS sound transducer.

7. A method for operating a piezoelectric MEMS sound transducer operating in the audible wavelength spectrum and/or in the ultrasonic range, wherein a transfer unit is available to transfer electrical energy between an energy store and the piezoelectric MEMS sound transducer and the transfer unit and the piezoelectric MEMS sound transducer are connected in a parallel circuit with respect to one another, the method comprising the following steps:

in order to operate the piezoelectric MEMS sound transducer in a first switching state, the transfer unit is first of all charged from the energy store and this transfer unit is then discharged again in a second switching state and the piezoelectric MEMS sound transducer is charged in this case and in order to recover energy in a third switching state, the piezoelectric MEMS sound transducer is discharged again and the transfer unit is charged in this case, and this transfer unit is then discharged again in a fourth switching state and the energy store is charged in this case, wherein the energy store, the transfer unit, and the piezoelectric MEMS sound transducer form an electrical, resonant, oscillating circuit, wherein the switches and/or switching units are switched in such a way that the switching takes place in a current zero crossing of the electrical, resonant oscillating circuit.

8. A circuit comprising:
at least one energy store, in which electrical energy can be stored,
a piezoelectric MEMS sound transducer operating in the audible wavelength spectrum and/or in the ultrasonic range, and
a transfer unit configured and disposed for transferring the electrical energy between the energy store and the piezoelectric MEMS sound transducer;
wherein the energy store, the transfer unit and/or the piezoelectric MEMS sound transducer form an electrical, resonant, oscillating circuit, and so the electrical energy stored in the electrical, resonant, oscillating circuit is capable of oscillating between the particular components; and
wherein the transfer unit and the piezoelectric MEMS sound transducer are configured in a parallel electrical circuit with respect to one another and which are configured to be operated with according to a method comprising the following steps:
charging the transfer unit from the energy store;
discharging the transfer unit and charging the piezoelectric MEMS sound transducer;
discharging the piezoelectric MEMS sound transducer and charging the transfer unit; and
discharging the transfer unit and charging the energy store.

9. The circuit as claimed in claim 8, wherein the circuit comprises a first transfer unit, wherein a first current path extends through the first transfer unit and a third current path extends through the piezoelectric MEMS sound transducer, and wherein an electric current can be applied to the two current paths independently of one another.

10. The circuit as claimed in claim 8, wherein the circuit comprises a second transfer unit, wherein a second current path extends through the second transfer unit and the third current path extends through the piezoelectric MEMS sound transducer, and wherein an electric current can be applied to the two current paths independently of one another.

11. The circuit as claimed in claim 8, wherein the first transfer unit and the second transfer unit are situated in a parallel circuit, and so current can be applied to the first current path and to the second current path independently of one another.

12. The circuit as claimed in claim 8, wherein the first transfer unit and the piezoelectric MEMS sound transducer are situated with respect to one another in such a way that a first circuit is formed, and/or the second transfer unit and the piezoelectric MEMS sound transducer are situated with respect to one another in such a way that a second circuit is formed.

13. The circuit as claimed in claim 8, wherein the first transfer unit and/or the second transfer unit comprise an energy storage unit, in particular a coil having an inductance, so that the electrical energy can be stored in the transfer units.

14. The circuit as claimed in claim 8, wherein the energy store comprises a capacitor having a capacitance, so that the electrical energy can be stored therein.

15. A circuit that comprises:
an energy store that stores electrical energy;
a first circuit that includes a first transfer unit electrically connected in parallel with a piezoelectric MEMS sound transducer operating in the audible wavelength spectrum and/or in the ultrasonic range;

a second circuit that includes a second transfer unit electrically connected in parallel with the piezoelectric MEMS sound transducer;

wherein each of the first and second transfer units is configured and disposed for transferring electrical energy between the energy store and the piezoelectric MEMS sound transducer;

a controller; and a plurality of switching units and/or switches, which include transistors, and/or diodes, which define a first current path, a second current path and a third current path, so that particular switching states can be formed, wherein the switching units and/or switches can be activated with the aid of the controller in such a way that the first current path, the second current path, the third current path, the first circuit, and/or the second circuit can be interrupted or made to be conductive, so that an electric current in the particular current paths and/or circuits can be interrupted and/or conducted;

wherein each of the first and second transfer units and the piezoelectric MEMS sound transducer are configured to be operated according to a method comprising the following steps:

charging the transfer unit from the energy store;

discharging the transfer unit and charging the piezoelectric MEMS sound transducer;

discharging the piezoelectric MEMS sound transducer and charging the transfer unit; and discharging the transfer unit and charging the energy store.

16. A circuit as claimed in claim 8, wherein the energy store, the MEMS sound transducer, and the transfer unit are formed in an application specific integrated circuit.

* * * * *